United States Patent
Tsuchiya et al.

(10) Patent No.: US 9,202,726 B2
(45) Date of Patent: Dec. 1, 2015

(54) MANUFACTURING METHOD OF SEMICONDUCTOR DEVICE AND DRY ETCHING APPARATUS FOR THE SAME

(71) Applicant: DENSO CORPORATION, Kariya, Aichi-pref. (JP)

(72) Inventors: Yoshinori Tsuchiya, Nagoya (JP); Shinichi Hoshi, Okazaki (JP); Masaki Matsui, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/159,055

(22) Filed: Jan. 20, 2014

(65) Prior Publication Data
US 2014/0273482 A1   Sep. 18, 2014

(30) Foreign Application Priority Data
Mar. 18, 2013  (JP) .................................. 2013-55206

(51) Int. Cl.
*H01L 21/302* (2006.01)
*H01L 21/67* (2006.01)
*H01L 21/311* (2006.01)
(Continued)

(52) U.S. Cl.
CPC .......... *H01L 21/67069* (2013.01); *H01J 37/321* (2013.01); *H01L 21/3065* (2013.01); *H01L 21/30621* (2013.01); *H01L 21/31116* (2013.01); *H01L 29/4236* (2013.01);
(Continued)

(58) Field of Classification Search
CPC .................... H01L 21/3065; H01L 21/31105; H01L 21/31116; H01L 21/31144; H01L 21/312; H01L 21/0243

USPC ......... 438/706, 708, 712, 714, 788, 709, 710; 216/65, 66, 67
See application file for complete search history.

(56) References Cited

U.S. PATENT DOCUMENTS 5,401,357 A * 3/1995 Okuhira et al. ............... 438/694
2004/0192043 A1 9/2004 Makita et al.
(Continued)

FOREIGN PATENT DOCUMENTS

| JP | 2007-142175 A | 6/2007 |
| JP | 2008-244324 A | 10/2008 |
| JP | 2010-129887 A | 6/2010 |

OTHER PUBLICATIONS

A. Tempez et al., "Photoenhanced reactive ion etching of III-V nitridesin BCl3/CL2/Ar/N2 plasmas", J. Vac. Sci. Technol., American Vacuum Society, Aug. 1999, A 17 (4). pp. 2209-2213.
(Continued)

*Primary Examiner* — Lan Vinh
(74) *Attorney, Agent, or Firm* — Posz Law Group, PLC

(57) ABSTRACT

A manufacturing method of a semiconductor device including arranging a compound semiconductor above a stage of a chamber, supplying an etching gas into the chamber, and generating a plasma in the chamber is provided. The compound semiconductor includes a group-III element nitride as a main component. A surface of the compound semiconductor is processed by a dry etching. Light is irradiated into the chamber during the generating of the plasma. A dry etching apparatus including a chamber including a stage, on which a compound semiconductor is mounted, and a light source irradiating light into the chamber is provided. The chamber is supplied with an etching gas. A plasma is generated in the chamber. A surface of the compound semiconductor is an object of a dry etching.

10 Claims, 6 Drawing Sheets

(51) Int. Cl.
*H01L 21/3065* (2006.01)
*H01J 37/32* (2006.01)
*H01L 21/306* (2006.01)
*H01L 29/423* (2006.01)
*H01L 29/66* (2006.01)
*H01L 29/778* (2006.01)
*H01L 29/20* (2006.01)

(52) U.S. Cl.
CPC ..... *H01L 29/66462* (2013.01); *H01L 29/7787* (2013.01); *H01J 2237/334* (2013.01); *H01L 29/2003* (2013.01)

(56) References Cited

U.S. PATENT DOCUMENTS

| | | | | |
|---|---|---|---|---|
| 2008/0124851 | A1* | 5/2008 | Zhang et al. | 438/172 |
| 2010/0087052 | A1* | 4/2010 | Xu | 438/530 |
| 2010/0099268 | A1* | 4/2010 | Timans | 438/761 |
| 2011/0237051 | A1* | 9/2011 | Hess et al. | 438/478 |

OTHER PUBLICATIONS

Office Action mailed on Apr. 14, 2015 in corresponding JP Application No. 2013-055206 (with English translation).

\* cited by examiner

US 9,202,726 B2

MANUFACTURING METHOD OF SEMICONDUCTOR DEVICE AND DRY ETCHING APPARATUS FOR THE SAME

CROSS REFERENCE TO RELATED APPLICATION

This application is based on Japanese Patent Application No, 2013-55206 filed on Mar. 18, 2013, the disclosure of which is incorporated herein by reference.

TECHNICAL FIELD

The present disclosure relates to a manufacturing method of a semiconductor device and a dry etching apparatus for the manufacturing method. The manufacturing method includes a dry etching process, in which a compound semiconductor including group-III element nitride is processed.

BACKGROUND

Conventionally, a method of a technology to reduce damage of a GaN layer, which is made from a group-III element nitride, is proposed in, for example, Patent Document JP-B-4479222 (corresponding to US 2004/0192043 A1). A compound semiconductor layer includes a first compound semiconductor layer and a second compound semiconductor layer. The second compound semiconductor layer is layered on the first compound semiconductor layer, and the first compound semiconductor layer includes nitrogen. The second compound semiconductor layer is dry etched, so that the first compound semiconductor layer is partially exposed. After the dry etching process, a damage layer caused by the dry etching process is removed by heat process in a nitrogen atmosphere, and then an etching process is performed by a nitrogen plasma, so that the damage caused by a nitrogen vacancy in the first compound semiconductor layer is recovered.

In addition, another method to perform a plasma process with a substrate including a compound semiconductor is known. In this method, a halogen gas is included in a process gas. The substrate is heated to be equal to or more than a boiling point of a compound including substrate material and a halogen element in the halogen gas, and a surface of the substrate is processed.

The inventors of the present disclosure have found the following difficulties.

In the method described in Patent Document JP-B-4479222, after the dry etching is performed, in order to reduce the damage caused by the dry etching process, the heat process and a post process using the nitrogen plasma need to be added. Therefore, a manufacturing process may become more complicated, and a manufacturing cost may be increased.

In addition, when a plasma process, in which the substrate is heated equal to or more than a boiling point of a compound including a halogen gas and a substrate material, is used, the boiling point is high, and therefore a resist process is not applicable. As a result, a manufacturing process may be complicated. For example, when a chloride gas is used as the halogen gas, the boiling point of $GaCl_3$, which is a reaction product with the GaN layer, is 201 degree Celsius. It is high enough that a resist is carbonized. Thus, it is impossible to use a simple resist in the dry etching process. Therefore, it is necessary to accumulate a hard mask such as a $SiO_2$ layer or the like on the GaN layer, and to pattern the $SiO_2$ layer or the like.

SUMMARY

It is an object of the present disclosure to simplify a manufacturing process in a manufacturing method of a semiconductor device. In the manufacturing method, a compound semiconductor including a group-III element nitride as a main component is dry etched.

According to a first example of embodiments, a manufacturing method of a semiconductor device including arranging a compound semiconductor above a stage of a chamber, supplying an etching gas into the chamber, and generating a plasma in the chamber is provided. The compound semiconductor includes a group-III element nitride as a main component. A surface of the compound semiconductor is processed by a dry etching. Light is irradiated into the chamber during the generating of the plasma.

According to a second example of the present disclosure, a dry etching apparatus including a chamber having a stage, on which a compound semiconductor is mounted, and a light source irradiating light into the chamber is provided. The chamber is supplied with an etching gas. A plasma is generated in the chamber. A surface of the compound semiconductor is performed by the dry etching.

According to the above manufacturing method of the semiconductor device and the dry etching apparatus, it is possible to simplify the manufacturing process in the manufacturing method of the semiconductor device.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

In the following, embodiments of the present disclosure will be explained with reference with drawings. Incidentally, in following embodiments, identical or similar parts each other are denoted by the same symbol.

First Embodiment

The first embodiment of the present disclosure will be explained with reference to FIG. 1 to FIG. 5. In the present embodiment, a manufacturing method according to an embodiment of the present disclosure is applied in a dry etching process of a manufacturing process of a semiconductor device described in FIG. 1.

Figure 1:
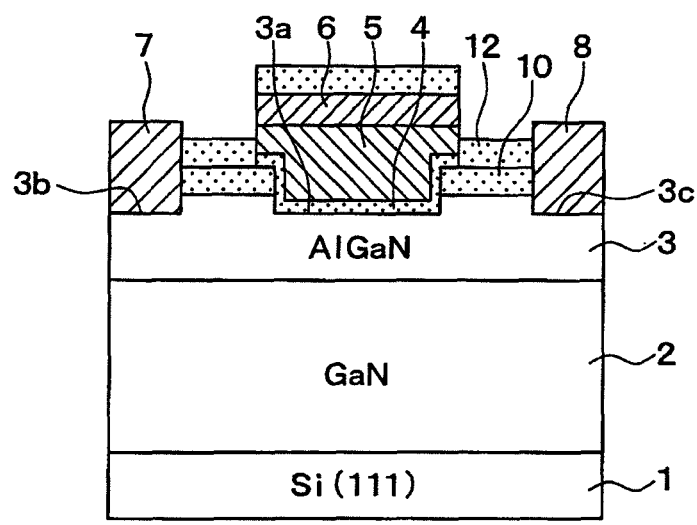
FIG. 1 is a cross sectional view illustrating an example of a semiconductor device that is manufactured by a manufacturing method according to a first embodiment of the present disclosure.

As described in FIG. 1, the semiconductor device according to the present disclosure includes a lateral high electron mobility transistor (HEMT), which corresponds to an example of GaN HEMT devices. The HEMT is configured as following.

The lateral HEMT has a semi-insulating substrate 1 (hereinafter, may also be referred to as a substrate), a GaN layer 2, and a n-type AlGaN layer 3. The GaN layer 2 and the n-type AlGaN layer 3 are layered on a surface of the semi-insulating substrate 1 to configure a compound semiconductor substrate of the lateral HEMT. In a GaN layer side of an AlGaN/GaN interface, a two-dimensional electron gas (2 DEG) carrier is induced by a piezoelectric effect and a polarizing effect. The semi-insulating substrate 1 is configured from a semi-insulating material or a semiconductor material, such as Si (111), SiC, sapphire, or the like. On the semi-insulating substrate 1, the GaN layer 2 and the AlGaN layer 3 are formed by, for example, a heteroepitaxial growth. A resistivity value of the semi-insulating substrate 1 may be arbitrarily set by an impurity concentration in the semi-insulating substrate 1 based on a property of an object device. It may be effective that an AlGaN—GaN superlattice layer or the like is interposed between the GaN layer 2 and the semi-insulating substrate 1, and that a crystalline property of the GaN layer 2 is improved. Herein the crystalline property denotes a fault, a dislocation, or the like in the GaN layer, and denotes what influences an electrical property or an optical property. The surface of the AlGaN layer 3 is provided with a recess 3a, and grooves 3b, 3c. The recess 3a is placed between the groove 3b and the groove 3c. The recess 3a has a shape of a recess shape, or in other words, the recess 3a corresponds to a concavity.

A position where the recess 3a is provided on the surface of the AlGaN layer 3 has a gate structure including a gate insulation film 4 and a gate electrode 5. The gate insulation film 4 is provided within the recess 3a and around the recess 3a. The gate electrode 5 is formed above the gate insulation film 4. The gate insulation film 4 is made from an oxide film or the like. The gate electrode 5 includes Poly-Si or the like which has been doped with impurities. On the surface of the gate electrode 5, a gate wiring layer 6 including aluminum (Al) or the like is provided. Incidentally, material and structure of a gate electrode and a gate insulation film may be arbitrarily selected in view of a threshold voltage, a withstand voltage, a long-term reliability, or the like of the object device. It may be effective that, other than the Si oxide film, a high-dielectric constant material such as a Si nitride film, a SiON, $Al_2O_3$, $La_2O_3$, or the like, are used as the material of the gate insulation film. In addition, a mixture film or a layered film configured by the above materials may be used. Furthermore, it may be possible to dope nitrogen, Si, or the like by using a high-temperature heat process or a plasma process in order to suppress a poly crystallization of a high dielectric constant film.

A position where the groove 3b is provided on the surface of the AlGaN layer 3 has a source electrode 7 within the groove 3b. A position where the groove 3c is provided on the surface of the AlGaN layer 3 has a drain electrode 8 within the groove 3c. The source electrode 7 and the drain electrode 8 form an ohmic contact with the surface of the groove 3b and the groove 3c, respectively. According to this configuration, the lateral HEMT according to the present embodiment is configured. A distance between the source electrode and the gate electrode, and a distance between the gate electrode and the drain electrode may be determined in view of ON resistance and withstand voltage of the object device.

The lateral HEMT performs a switching operation by applying a gate voltage to the gate electrode 5. Specifically, by applying the gate voltage to the gate electrode 5, density of an electron layer (corresponding to a channel) below the gate electrode 5 is controlled. Electric current flows between the source electrode and the drain electrode by applying voltage to a portion between the source electrode and the drain electrode. Herein, the electron layer is configured by the 2 DEG in the GaN layer side of the GaN layer 2 and the AlGaN layer 3.

In the lateral HEMT, based on a surface state of the recess 3a below the gate structure, a concentration of the two-dimensional electron gas and a channel mobility are changed, so that the ON resistance is influenced. Thus, it may be preferable that the surface state of the recess 3a is in a good condition. In addition, the surface states of a contact portion (corresponding to the groove 3b) between the source electrode 7 and the AlGaN layer 3, and another contact portion (corresponding to the groove 3c) between the drain electrode 8 and the AlGaN layer 3 may influence contact resistance. An electron tunnels from the source electrode or the drain electrode to the AlGaN layer 3, and the electron reaches the source electrode 7 or the drain electrode 8. When the 2 DEG density of the interface between the AlGaN layer 3 and the GaN layer 2 is small, the contact resistance, which corresponds to a parasitic resistance component of the HEMT, may increase. Since the surface status of the grooves 3b, 3c influences the contact resistance, it may be preferable that the surface status of the grooves 3b, 3c is in a good condition. Herein, the good condition of the surface status denotes that, at the surface of the AlGaN layer 3 or at the inside close to the surface in the AlGaN layer 3, densities of an exogenous crystal defect, a dislocation, a crack or impurity are kept low, and the 2 DEG density and mobility are not significantly reduced from a time when the AlGaN or GaN epitaxial growth is performed.

In the present embodiment, when the recesses 3a and the grooves 3b, 3c are formed, the manufacturing method according to the present embodiment in the present disclosure is applied. In the following, the manufacturing method of the lateral HEMT according to the present embodiment will be explained with reference to FIG. 2A to FIG. 4.

Figure 2A:
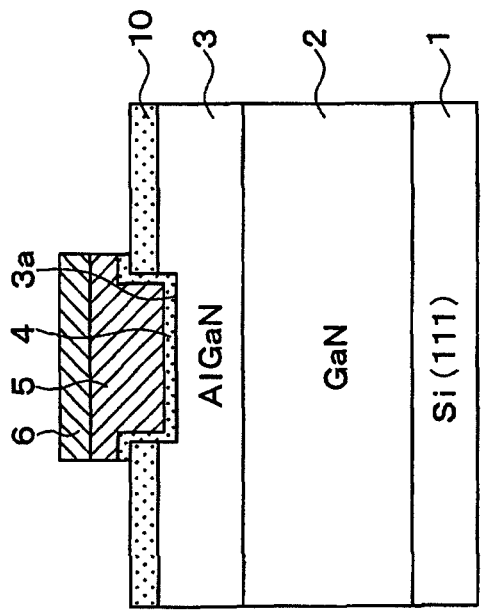
FIGS. 2A to 2D are cross sectional views illustrating a manufacturing process of the semiconductor device described in FIG. 1.

(Process in FIG. 2A)

The compound semiconductor substrate is prepared. In the compound semiconductor substrate, the GaN layer 2 is layered above the surface of the semi-insulating substrate 1, which is made from Si (111), SiC, sapphire, or the like. The n-type AlGaN layer 3 is layered above the GaN layer 2. For example, above the surface of the semi-insulating substrate 1, the GaN layer 2 and the AlGaN layer 3 are formed by, for example, a metal organic chemical vapor deposition (MOCVD) method, and a molecular beam epitaxy (MBE) method in an ultrahigh purity and a high precision.

Figure 2B:
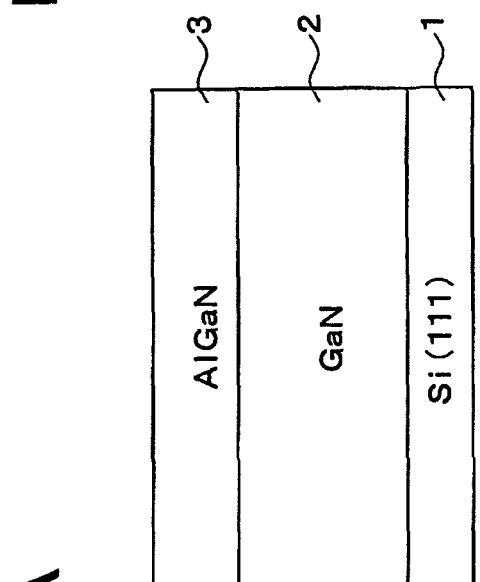

(Process in FIG. 2B)

An oxide film 10 corresponding to an interlayer film is provided above the surface of the AlGaN layer 3, and a resist 11 corresponding to the second mask is provided above the surface of the oxide film 10. After the resist 11 is patterned by a photolithography process, the oxide film 10 is patterned with using the resist 11 as a mask. Accordingly, the resist 11 and the oxide film 10 on the surface of the AlGaN layer 3 are opened at a recess-forming-planning position. After this process, the dry etching process is performed by using the resist 11 and the oxide film 10 as the mask. The surface of the AlGaN layer 3 is recessed, and the recess 3a is provided. The dry etching process is performed by an inductively coupled plasma (ICP) dry etching apparatus described in FIG. 3.

Figure 3:
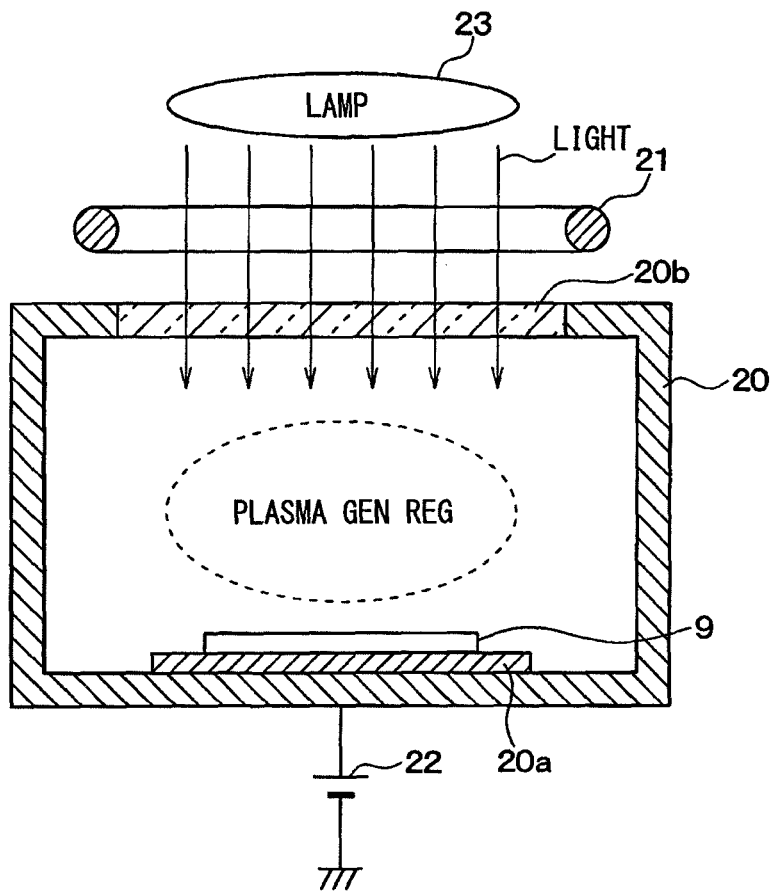
FIG. 3 is a cross sectional view schematically illustrating a dry etching apparatus used in a dry etching process of the manufacturing process of the semiconductor device described in FIGS. 2A to 2D.
Figure 4:
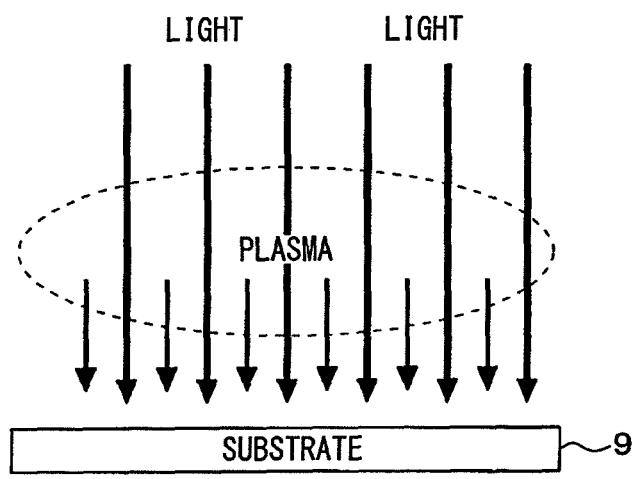
FIG. 4 is a diagram illustrating a state in a chamber in the dry etching process.

As described in FIG. 3, the ICP dry etching apparatus has a chamber 20, an ICP electrode 21, a bias power supply 22, and a lamp 23. The etching process is performed in the chamber 20.

The lamp 23 in the present embodiment may be an example of a light source.

The chamber 20 contains a stage 20a and has an incidence part 20b at the upper surface of the chamber 20. The incidence part is made from translucent material such as quartz. A substrate 9, which is an etching object, is mounted on the stage 20a. The dry etching process is performed in which a plasma generation region is provided above the stage 20a. The substrate 9 has the GaN layer 2, the AlGaN layer 3, the oxide film 10, and the resist 11 above the semi-insulating substrate 1. In the chamber 20, light from the lamp 23 is irradiated to the plasma generation region and the surface of the substrate 9 on the stage 20a through the incidence part 20b. In addition, the chamber 20 has a pressure reducing mechanism or the like. The pressure reducing mechanism introduces an etching gas, atmosphere gas, or the like from a not-shown gas introduction hole, and controls etching pressure.

The ICP electrode 21 supplies the chamber 20 with electric power having a predetermined ICP power. In the present embodiment, the ICP electrode 21 corresponds to an annular electrode, for example. Light from the lamp 23 goes through a hollow part of the ICP electrode 21, and is irradiated to the chamber 20. The bias power supply 22 applies a predetermined bias to the substrate 9 through the stage 20a.

The lamp 23 corresponds to a light source irradiating light for accelerating a reaction, and is either a xenon (Xe) lamp, a mercury/xenon (Hg—Xe) lamp, or an ultraviolet ray (UV) lamp. In the present embodiment, the lamp 23 is placed above the chamber 20. Light irradiated from the lamp 23 may be any kind of light. It may be preferable that a wavelength and strength of the light is appropriately selected to reduce damage of the etching object (in the present embodiment, AlGaN layer 3) in the dry etching process. For example, it may be preferable that irradiated light includes a wavelength component, which is shorter than 500 nm. In this case, it may be possible to obtain high power for accelerating the plasma generation and the etching reaction. In addition, it may be preferable that the lamp 23 performs light irradiation from a direction perpendicular to the substrate 9 placed above the stage 20a in order to reduce uneven light irradiation. For example, it may be possible to configure the lamp 23 including (i) a light source irradiating parallel light from a position facing the substrate 9, or (ii) a light source for parallelizing diffused light from one light source by using a lens or the like.

By using the ICP dry etching apparatus, the substrate 9 is placed on the stage 20a, and the dry etching process is performed. As described above, in the substrate 9, the GaN layer 2 and the AlGaN layer 3 are provided above the surface of the semi-insulating substrate 1, and the mask provided by the resist 11 and the oxide film 10 is formed above the AlGaN layer 3.

First, it is supposed that the ICP power by the ICP electrode 21 is set to a range between 10 W to 1000 W, and the bias power by the bias power source 22 is set to equal to or less than 100 W. The ICP power is set to a power that is generally used in the ICP dry etching process. The bias power at more than 100 W may be too strong, and it may be possible to reduce effects by the light irradiation. Thus, the bias power is set to equal to or less than 100 W. Strength of the light irradiation based on luminescence of Xe or the like by the lamp 23 is set to equal to or more than 0.05 mW/cm$^2$ at the surface of the substrate 9, which corresponds to the etching object, and preferably, may be set to equal to or more than 0.1 mW/cm$^2$. A substrate temperature is set to equal to or less than 250 degree Celsius when the mask includes the resist 11 like the present embodiment. It may be possible that the substrate temperature is equal to or more than 250 degree Celsius when only a hard mask such as an oxide film (SiO$_2$) is used.

The pressure in the chamber 20 is set to a range between 0.01 Pa to 10 Pa, and the etching gas is introduced into the chamber 20. It may be possible that the pressure in the chamber 20 is set to a value other than the above range, and the pressure in the chamber 20 may be appropriately selected based on a depth and a shape of a lateral surface of the recess 3a, which is dry etched. For example, the etching gas corresponds to a chlorine gas, a mixture gas including the chlorine gas, or a BCl$_3$. When the above etching gas is used, it is possible to obtain a high etching rate, and to shorten a time required for the dry etching process. Incidentally, any kind of etching gases may be appropriately used based on material of an etching object layer and a shape of the etching object layer.

By performing the dry etching process, the recess 3a is formed. Plasma having a constitutional element of the etching gas is generated in the plasma generation region in the chamber 20. A plasma irradiation and the light irradiation are performed to the surface of the substrate 9 at the same time, as described in FIG. 4. Accordingly, it is possible to accelerate the dry etching reaction, and to provide the recess 3a in a short time without increasing the substrate bias voltage, which adds ion collision damage to an etching surface. Thus, it is possible to reduce the damage to the recess 3a. Since exposure time of the etching surface to the plasma atmosphere is shortened, introduction of an atmosphere element, which provides a Coulomb scattering center of the 2 DEG mobility induced inside the substrate, and concentration of a lattice imperfection are decreased.

Specifically, a reaction speed of the dry etching is controlled by either component of a plasma generating density, a supply speed of plasma atoms, a diffusion of an etchant on a substrate surface, an etching reaction speed, and a desorption speed of a reaction product, or any combination of the above components. It is possible to increase the above speed by the light irradiation. Thus, it is possible to accelerate the dry etching reaction, and to obtain the above described effect. Especially, as described in the present embodiment, it is preferable that a configuration where the light irradiation is performed in a direction perpendicular to the surface of the substrate 9 is applied when the etching reaction speed of the substrate surface corresponds to a rate determining process. In the present embodiment, the light irradiation is directly performed to the substrate 9, and therefore, it is possible to increase the etching reaction speed of the substrate surface. According to this configuration, when the etching reaction speed of the substrate surface corresponds to the rate determining process, especially, the etching reaction speed of the substrate surface is increased and it is possible to effectively accelerate the dry etching reaction. The etching depth of AlGaN may be determined in view of a threshold voltage and a channel resistance of the object device. When the etching depth is deepened, the threshold voltage is changed to a positive voltage side. The mobility is substantially increased as the etching depth is deepened. At a region where AlGaN residual film thickness is thin, the mobility deteriorated component that is added by the etching process becomes apparent and the mobility is determined by a trade off relationship between the etching depth and the mobility deteriorated component.

After the recess 3a is formed, the resist 11 that has been used as the mask of the dry etching is removed, and the dry etching process is finished.

Incidentally, in the drawings, it is exemplified that the depth of the recess 3a, which is formed by the dry etching process, is shallower than the thickness of the AlGaN layer 3. A HEMI structure may be possible in which the depth of the recess 3a is equal to a position of an interface between the AlGaN layer 3 and the GaN layer 2, or is deeper than the thickness of the AlGaN layer 3 (i.e., corresponding to a case where the recess 3a is in the GaN layer 2). In this case, carrier density in an interface between the gate insulation film and the GaN layer may be controlled by a gate voltage.

Figure 2C:
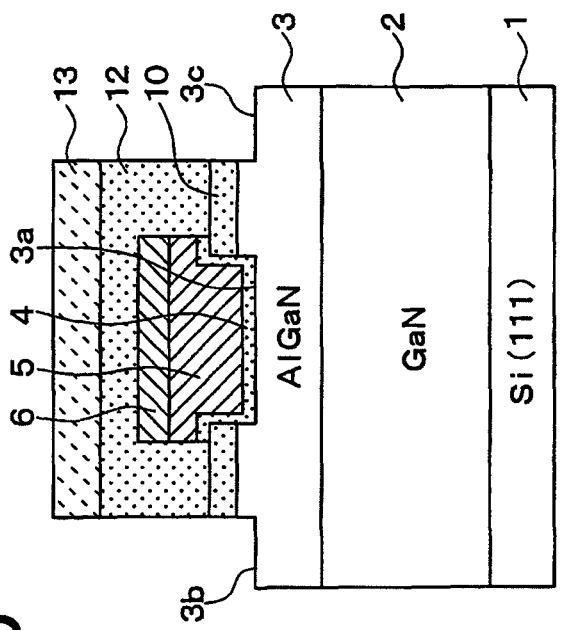

(Process in FIG. 2C)

An insulation film such as the oxide film, and metal material such as Ply-Si or Al doped by impurities are layered in order above the surface of the AlGaN layer 3 and the inside of the recess 3a. The above layers are patterned by a not-shown mask. According to this process, the gate insulation film 4, the gate electrode 5, and the gate wiring layer 6 are provided.

Figure 2D:
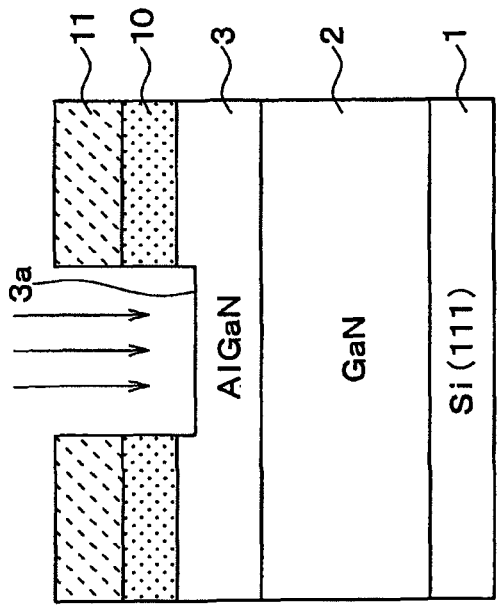

(Process in FIG. 2D)

The insulation film and the mask cover the gate insulation film 4, the gate electrode 5, and the gate wiring layer 6. The insulation film and the mask have opening at a forming-planning position of the grooves 3b, 3c. For example, it may be possible to provide the insulation film by forming the resist 13, corresponding to the mask, above the surface of the oxide film 12 after the oxide film 12 is provided.

The dry etching process about the oxide film 12 and the AlGaN layer 3 is performed by using the resist 13. The grooves 3b, 3c are provided on the surface of the AlGaN layer 3. The dry etching process in this case is similar to the dry etching process for providing the recess 3a described in FIG. 2B. The depth of the grooves 3b, 3c may be controlled so that a contact resistance becomes minimum. When the depth of the grooves 3b, 3c are too shallow, the electrode is far from the interface between the AlGaN layer 3 and the GaN layer 2, and the contact resistance becomes large. When the depth is too deep, the 2 DEG density in the interface between the AlGaN layer 3 and the GaN layer 2 is decreased, and the contact resistance becomes large. After the dry etching process, the resist 13 is removed.

The process after the above described process is substantially similar to a conventional process. An interlayer insulation film production process, a contact hole production process, a production process for the source electrode 7 and the drain electrode 8, or the like are performed, so that the semiconductor devices having the lateral HEMT described in FIG. 1 is provided.

As described above, in the present embodiment, when a surface of the compound semiconductor is processed by the dry etching process, the plasma generation region is irradiated by the Xe lamp, the Hg—Xe lamp, the UV lamp, or the like in order to accelerate the dry etching reaction. Accordingly, it is possible that the recess 3a is provided by a low substrate bias power in a shorter time, and it is possible to reduce damage to the recess 3a. Therefore, even when the post process with the heat process or nitrogen plasma after the dry etching process is not performed, it is possible to provide the recess 3a with reduced damage, and the grooves 3b, 3c with reduced damage. Thus, in a manufacturing method of the semiconductor device, it is possible to simplify the manufacturing process. The manufacturing method includes the dry etching process in which the compound semiconductor including group-III element nitride as a main component is processed. The group-III element corresponds to gallium (Ga), aluminum (Al), indium (In), for example.

According to the present disclosure, the damage in the recess process is reduced since only the dry etching process is performed. Therefore, it is possible to use the resists 11, 13 as the mask when the recess process is performed at the substrate temperature of equal to or less than 250 degree Celsius. Thus, it is possible to simplify the manufacturing process further.

Figure 5:
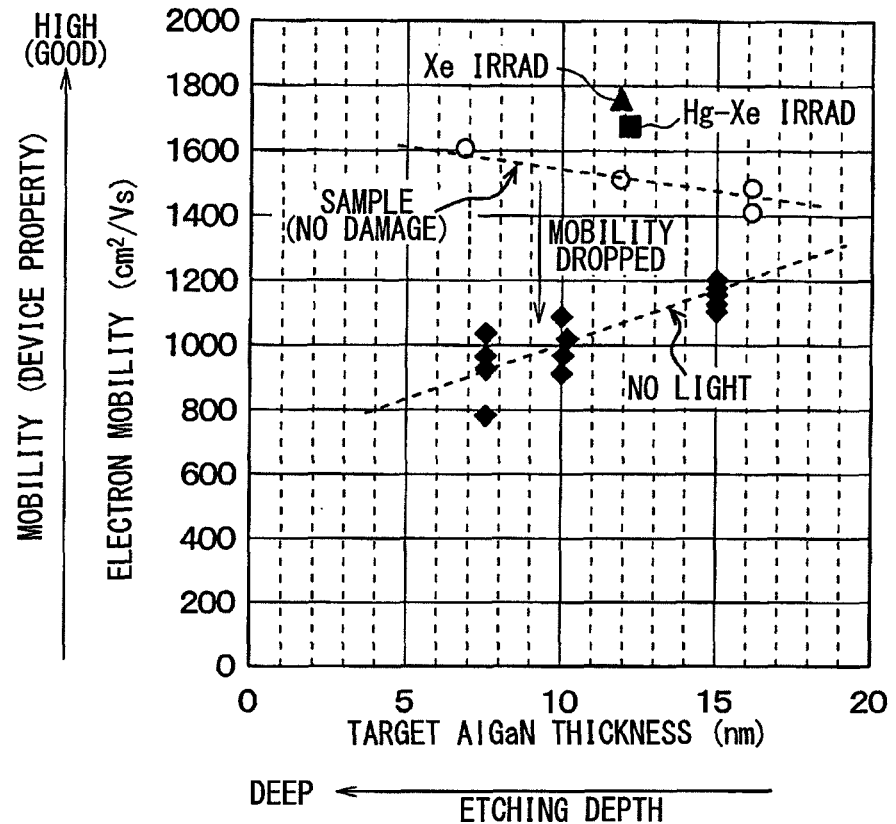
FIG. 5 is a diagram illustrating an experimental result of electron mobility in a lateral HEMT.

As reference information, the 2 DEG mobility after the dry etching process providing the recess 3a, and the grooves 3b, 3c is determined by Hall measurement in a case where the light irradiation is performed by the lamp 23, or in a case where the light irradiation is not performed. Furthermore, the 2 DEG mobility is determined by Hall measurement in a case where AlGaN film thickness is controlled by an epitaxial growth control without an etching. FIG. 5 illustrates a result. When the light irradiation is performed, the mobility is substantially equal to a case where the epitaxial growth control is performed without damage (corresponding to a control sample). When the light irradiation is not performed, the mobility is lower than the control sample.

In FIG. 5, an open circle denotes a measured result of the control sample. A triangle denotes a measured result of a case where the Xe lamp has been irradiated. A filled square denotes a measured result of a case where the Hg—Xe lamp has been irradiated. A diamond denotes a measured result of a case where the light irradiation has not been performed.

Incidentally, in this experiment, the strength of the light irradiation is set to 0.24 mW/cm$^2$ at the substrate surface. When the strength of the light irradiation at the substrate surface is equal to or more than 0.05 mW/cm$^2$, the amount of decrease of the mobility is less than a case where the light irradiation is not performed. When the strength of the light irradiation at the substrate surface is equal to or more than 0.1 mW/cm$^2$, the etching rate increases. Therefore, based on the experimental result, the strength of the light irradiation at the surface of the substrate 9, which corresponds to the etching object, may be equal to or more than 0.05 mW/cm$^2$. It may be preferable that the strength of the light irradiation at the surface of the substrate 9 is equal to or more than 0.1 mW/cm$^2$.

Second Embodiment

The second embodiment of the present disclosure will be explained. In the second embodiment, a configuration of the dry etching apparatus used in the dry etching process is different from the first embodiment. The other configuration is similar to the first embodiment, and therefore, parts different from the first embodiment will explained.

Figure 6:
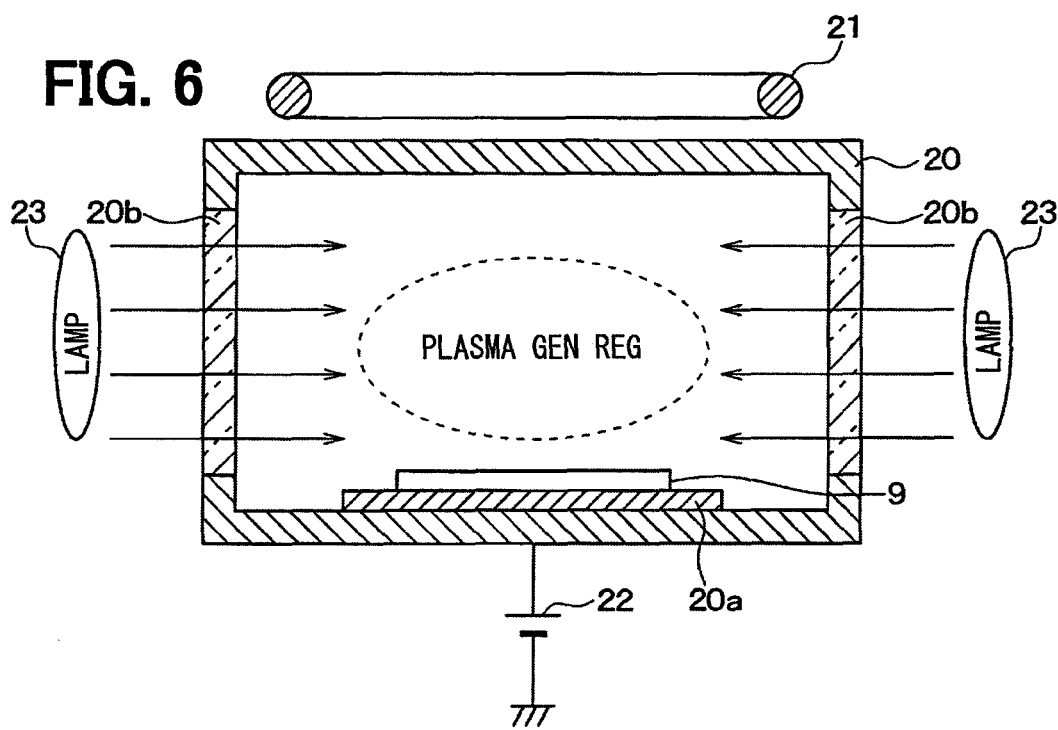
FIG. 6 is a cross sectional view schematically illustrating a dry etching apparatus according to a second embodiment.

As described in FIG. 6, in the present embodiment, the lamp 23 is opposed to a lateral side of the chamber 20, and the incidence part 20b, which includes the translucent material such as quartz and corresponds to one of the lateral sides of the chamber 20, is placed to a position corresponding to the lamp 23.

When the dry etching process as described in FIG. 2B and FIG. 2D is performed using the dry etching apparatus described above, it is possible to obtain technical effects, which are similar to the first embodiment. In addition, when the lamp 23 is opposed to the lateral side of the chamber 20 as the present embodiment, light emitted from the lamp 23 mainly irradiates the plasma generation region. When the reaction speed of the dry etching is determined by a supply speed of the plasma atoms, and the dry etching apparatus having the configuration of the present embodiment is used, generation of the plasma atoms is accelerated. It is possible to increase the supply speed of the plasma atoms.

Third Embodiment

The third embodiment of the present disclosure will be explained. In the third embodiment, the configuration of the semiconductor device, which corresponds to the etching object, is different from the first embodiment. The other configuration in the third embodiment is similar to the first embodiment, and parts different from the first embodiment will be explained.

Figure 7:
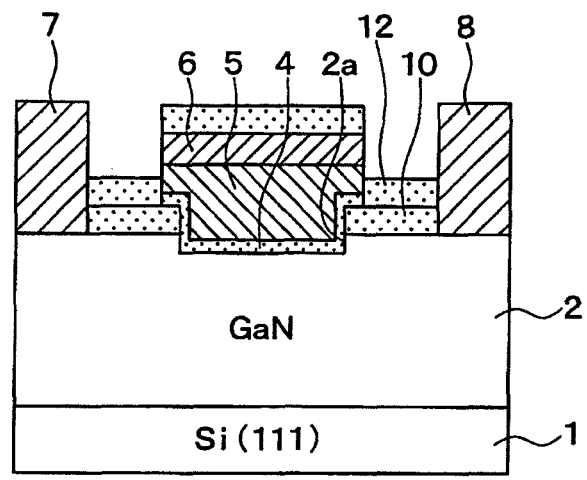
FIG. 7 is a cross sectional view illustrating an example of the semiconductor device manufactured by the manufacturing method according to a third embodiment in the present disclosure.

As described in FIG. 7, the lateral HEMT provided in the semiconductor device in the present embodiment includes the semi-insulating substrate 1 and the GaN layer 2 above the surface of the semi-insulating substrate 1. The semi-insulating substrate 1 is made from Si (111), SiC, sapphire, or the like. The GaN layer 2 has the recess 2a. At a position where the recess 2a is placed on the surface of the GaN layer 2, the lateral HEMT has the gate structure configured by the gate insulation film 4 and the gate electrode 5. The gate wiring layer 6, which is made from Al or the like, is provided above the surface of the gate electrode 5. The lateral HEMT includes the source electrode 7 and the drain electrode 8 above the surface of the GaN layer 2. The gate structure is placed between the source electrode 7 and the drain electrode 8. Each of the source electrode 7 and the drain electrode 8 performs the ohmic contact with the surface of the GaN layer 2. According to this configuration, the lateral HEMT in the present embodiment is configured.

Figure 8:
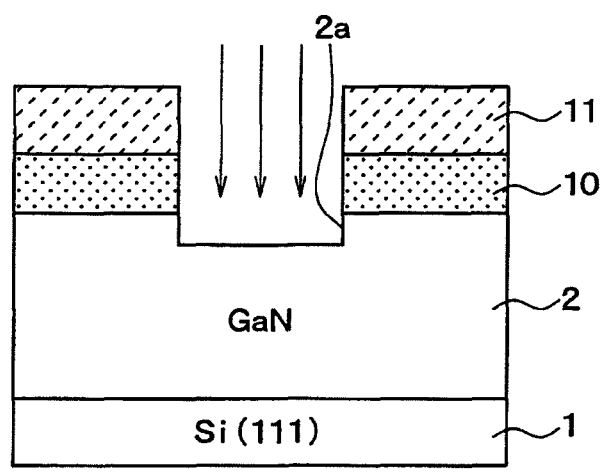
FIG. 8 is a cross sectional view illustrating the dry etching process in the manufacturing process of the semiconductor device described in FIG. 7.

The dry etching process is applicable to a transistor structure in which a gate part has the AlGaN layer 3 on the GaN layer 2 as described in the first embodiment. In addition, the dry etching process may also be applicable to a transistor structure in which a gate part has the GaN layer 2. For example, as described in FIG. 8, a mask that is made from the oxide film 10 and the resist 11 is provided above the surface of the GaN layer 2, and the recess 2a is provided by the dry etching process with using the mask. In this case, the dry etching process described in the first embodiment and the second embodiment may be applicable.

When the HEMT having the transistor structure with the GaN layer 2 at the gate part is provided, the above described dry etching process may be applicable. In this case, it may be possible to obtain the technical effects similar to the first embodiment and the second embodiment. The resistivity value of the substrate may be arbitrarily controlled by a concentration of impurities in the substrate according to the object device property. It may be effective that the AlGaN—GaN superlattice layer is interposed between the GaN layer and the semi-insulating substrate 1 to improve crystalline property of the GaN layer. Herein, the crystalline property denotes a fault, a dislocation, or the like in the GaN layer, and denotes what influences the electrical property or the optical property.

Fourth Embodiment

The fourth embodiment will be explained as follow. In the fourth embodiment, the configuration of the semiconductor device, which corresponds to the etching object, is different from the first embodiment. The other part other than the configuration of the semiconductor device is similar to the first embodiment. A part different from the first embodiment will be explained.

Figure 9:
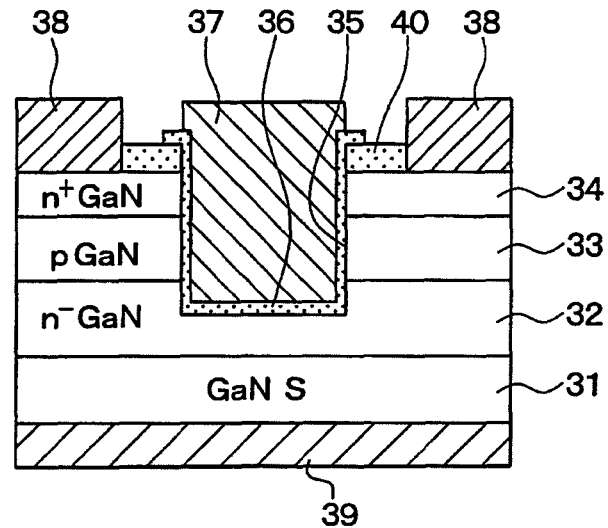
FIG. 9 is a cross sectional view illustrating an example of the semiconductor device manufactured by the manufacturing method according to a fourth embodiment in the present disclosure.

As described in FIG. 9, in the present embodiment, the semiconductor device has a vertical MOSFET. In the vertical MOSFET, above the surface of the GaN substrate 31, a $n^-$-type drift layer 32, a p-type base region 33, and a $n^+$-type source region 34 are formed and the compound semiconductor substrate is provided. The $n^-$-type drift layer 32, the p-type base region 33, and the $n^+$-type source region 34 are made from the GaN layer. A trench 35 penetrates the p-type base region 33 and the $n^+$-type source region 34, and reaches to the $n^-$-type drift layer 32. Within the trench 35, the gate electrode 37 is provided through the gate insulation film 36. In addition, the source electrode 38 is provided above the surface of the $n^+$-type source region 34. The drain electrode 39 is provided above a back surface of the GaN substrate 31. Thus, the GaN substrate is placed between the gate electrode 37 and the drain electrode 39. According to this configuration, the vertical MOSFET is configured by the compound semiconductor.

Figure 10:
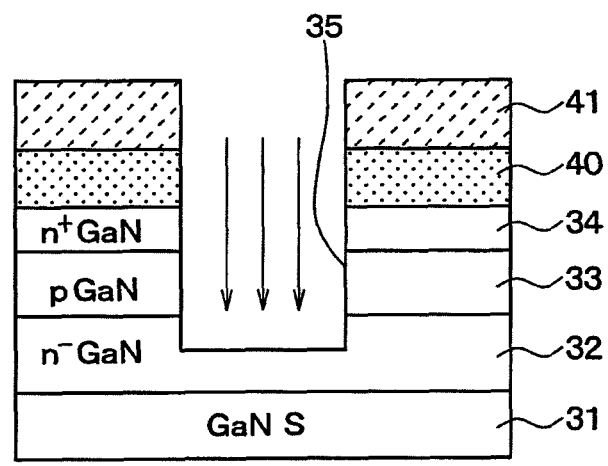
FIG. 10 is a cross sectional view illustrating the dry etching process in the manufacturing process of the semiconductor device described in FIG. 9.

Therefore, the dry etching process may be applicable in the vertical MOSFET as described in the present embodiment, in addition to the lateral HEMT as described in the first embodiment. For example, as described in FIG. 10, a compound semiconductor substrate is prepared in which, above the surface of the GaN substrate 31, the $n^-$-type drift layer 32, the p-type base region 33, and the $n^+$-type source region 34 are provided. Above the $n^+$-type source region 34, an oxide film 40 and a resist 41 are placed as masks. The dry etching is performed with using the mask, so that the trench 35 is provided. In this case, the dry etching process explained in the first embodiment and the second embodiment is applicable.

When the gate electrode 37 in the vertical MOSFET is applied with the gate voltage, a channel is provided at a lateral surface of the gate insulation film 36 in the p-type base region 33, so that current flows between the source electrode and the drain electrode. In the vertical MOSFET, when the trench 35 is provided, the dry etching process explained in the first embodiment and the second embodiment is applicable. Furthermore, when the dry etching process is used in a manufacturing of the vertical MOSFET, the technical effects similar to the first embodiment and the second embodiment is obtained.

Incidentally, in the vertical MOSFET, reduction of damage at the lateral surface of the trench 35, at which the channel is formed, is effective to improve the channel mobility. Thus, it may be preferable that each power and strength of the light irradiation in the dry etching process is arbitrarily set to reduce the damage at the lateral surface of the trench 35.

Another Embodiment

It should be noted that the present disclosure is not limited to the above described embodiment. It is possible to appropriately change embodiments within a scope of the present disclosure.

For example, in each of the embodiments, a dry etching process by which a compound semiconductor including a group-III element nitride as a main component is explained. In the dry etching process, the gate structure including the recesses 2a, 3a, or the trench 35 is provided. However, the process described above corresponds to an example. As long as the dry etching process is performed in the compound semiconductor that is mainly includes the group-III element nitride, it is applicable to the dry etching process of another part. Furthermore, group-III element nitride is not limited to GaN, which is described in each of the embodiments. The group-III element nitride may be nitrides of Al, In, or the like.

Incidentally, in the first embodiment, after the recess 3a is provided, the grooves 3b, 3c are provided. However, this providing order may be reversed, and the grooves 3b, 3c are provided before the recess 3a.

In addition to the switching device such as a lateral or a vertical MOSFET as explained in the embodiments, the present disclosure may be applicable to the dry etching process in a manufacturing of a lateral rectifier element or a vertical rectifier element, for example, a diode or the like. Furthermore, the present disclosure may be applicable to any other element, which is made from a compound semiconductor and other than the switching device and the rectifier element. Therefore, when the surface of the compound semiconductor is processed by the dry etching process, the present disclosure may be applicable. Accordingly, it may be possible to process the surface of the compound semiconductor in shorter time and to reduce damage of the processed surface.

According to the present disclosure, a manufacturing method of a semiconductor device including arranging a compound semiconductor, which includes a group-III element nitride as a main component, above a stage of a chamber, supplying an etching gas into the chamber, and generating a plasma in the chamber is provided. A surface of the compound semiconductor is processed by a dry etching. Light is irradiated into the chamber during the generating of the plasma.

According to the present disclosure, light is irradiated into the chamber during the dry etching by which a surface of a compound semiconductor is processed, and it is possible to accelerate a reaction of the dry etching. Accordingly, it is possible to process the surface of the compound semiconductor in a shorter time, and therefore it is possible to reduce damage in the surface. Therefore, without performing a heat process or a post process using a nitrogen plasma after the dry etching process, it is possible to process the surface and to simplify the manufacturing process in a manufacturing method of a semiconductor device. In the manufacturing method, a compound semiconductor, including a group-III element as a main component, is process by the dry etching.

In addition, the surface process is performed with a reduced damage due to the dry etching process. When a process is performed at the substrate temperature of equal to or less than 250 degree Celsius, it is possible to use a resist as a mask. Therefore, it is possible to simplify the manufacturing process moreover.

According to the present disclosure, a dry etching apparatus includes a chamber having a stage, on which a compound semiconductor is mounted, and a light source irradiating light into the chamber. The compound semiconductor includes a group-III element nitride as a main component. The chamber is supplied with an etching gas. A plasma is generated in the chamber. A surface of the compound semiconductor is processed by the dry etching.

As described above, when it is supposed that a dry etching apparatus includes a light source irradiating light into a chamber, the dry etching apparatus is suitable for performing the dry etching process described in the present disclosure.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A manufacturing method of a semiconductor device comprising:
    arranging a compound semiconductor, which includes a group-III element nitride as a main component, above a stage of a chamber;
    supplying an etching gas into the chamber;
    generating a plasma in the chamber with the compound semiconductor arranged therein and the etching gas supplied therein, so that a surface of the compound semiconductor is processed by a dry etching; and
    irradiating light into the chamber during the generating of the plasma, wherein
    a wavelength of the light that is irradiated is shorter than 500 nm, and
    the light is irradiated to the surface of the compound semiconductor in a direction perpendicular to the surface of the compound semiconductor, wherein
    the light is irradiated into the chamber during the generating of the plasma from a direction perpendicular to the substrate by a light source disposed to face the substrate, the light source irradiating parallel light.

2. The manufacturing method according to claim 1, wherein the light is irradiated on the surface of the compound semiconductor, and strength of the light at the surface is equal to or more than 0.05 mW/cm$^2$.

3. The manufacturing method according to claim 1, wherein
    a semiconductor device is either a lateral rectifier element, a vertical rectifier element, a lateral switching device, or a vertical switching device, and
    the semiconductor device includes an electrode disposed on the surface of the compound semiconductor, which is processed by the dry etching.

4. The manufacturing method according to claim 1, wherein
    during the irradiating of light into the chamber and the generating of the plasma, a temperature of the compound semiconductor is equal to or less than 250 degrees Celsius.

5. The manufacturing method according to claim 1, wherein
    the light is irradiated during the generating of the plasma from one light source, and diffused light from the one light source is parallelized.

6. The manufacturing method according to claim 1, wherein
    the etching gas is supplied into the chamber at a pressure in a range between 0.01 Pa to 10 Pa.

7. The manufacturing method according to claim 1, wherein
    the surface of the compound semiconductor that is processed by the dry etching is patterned using resist as a mask, further comprising
    removing the resist from the surface of the compound semiconductor, after the dry etching.

8. The manufacturing method according to claim 1, wherein:
    the light source irradiates the parallel light evenly on the surface of the compound semiconductor.

9. The manufacturing method according to claim 1, wherein
    the dry etching is performed by an inductively coupled plasma dry etching apparatus,
    the inductively coupled plasma dry etching apparatus has an inductively couple plasma electrode, the chamber is connected with a bias power source providing a bias power,
an electric power supplied to the inductively couple plasma electrode is between 10 W to 1000 W, and
the bias power is equal to or less than 100 W.

10. The manufacturing method according to claim 9, wherein:
the light source irradiates the parallel light evenly on the surface of the compound semiconductor.

* * * * *